July 19, 1966 KUNIO KAWAI ET AL 3,262,068

AUTOMATIC PHASE CONTROL CIRCUIT

Filed Oct. 9, 1964

INVENTORS
Kunio Kawai
Hiroyasu Nakamura
BY Takeo Nishimura

Wenderoth & Western

United States Patent Office 3,262,068
Patented July 19, 1966

3,262,068

AUTOMATIC PHASE CONTROL CIRCUIT

Kunio Kawai and Hiroyasu Nakamura, Yokohama-shi, and Takeo Nishimura, Tokyo-to, Japan, assignors to Kabushiki Kaisha Hitachi Seisakusho, Tokyo-to, Japan, a joint-stock company of Japan Filed Oct. 9, 1964, Ser. No. 402,734
Claims priority, application Japan, Oct. 18, 1963, 38/54,958
2 Claims. (Cl. 331—11)

This invention relates to improvements in or relating to automatic phase control circuits.

An automatic phase control circuit is herein understood to be a circuit which compares the phase of the voltage of a reference frequency with the phase of the voltage of a controlled oscillator, detects the voltage corresponding to the resulting difference, and accordingly causes the oscillation frequency of the oscillator to be phase synchronized with the reference frequency. However, unless the oscillation frequency of the controlled oscillator and the reference frequency are considerably close, a drawing effect (known also as a chain effect), that is, synchronism, cannot be attained. Accordingly, with an oscillator of high frequency which does not have too high a stabiilty, there is the possibility that synchronism cannot be attained.

It is an object of the present invention to remove the above mentioned possibility, even when the controlled oscillator has a frequency deviating considerably from the reference frequency, by causing this oscillator frequency to enter a frequency range wherein synchronism is possible.

According to the present invention, there is provided an automatic phase control circuit comprising a control circuit wherein there are provided a phase comparator, a reactance variable element circuit, and a self-excited type oscillator, and the oscillator is controlled by deriving, by means of the phase comparator, a voltage corresponding to the phase difference between a reference frequency and the oscillation frequency or an intermediate frequency of the oscillator and applying said voltage to the reactance variable element circuit and a positive feedback circuit provided between the oscillator and the reactance variable element circuit and comprising a frequency discriminator, a differentiating circuit, and a capacitor of a capacitance $C_1$ which satisfies the relationship expressed mathematically by $C_1R_1<T_2(K-1)$, where $R_1$ is the internal resistance of the frequency discriminator, $T_2$ is the time constant of the differentiating circuit, and K is the product of the discrimination sensitivity of the frequency discriminator and the reactance modulation sensitivity of the reactance variable element circuit.

Embodiments of the invention will now be described with reference to the accompanying drawing in which like parts are designated by like reference characters, and in which.

Figure 1:
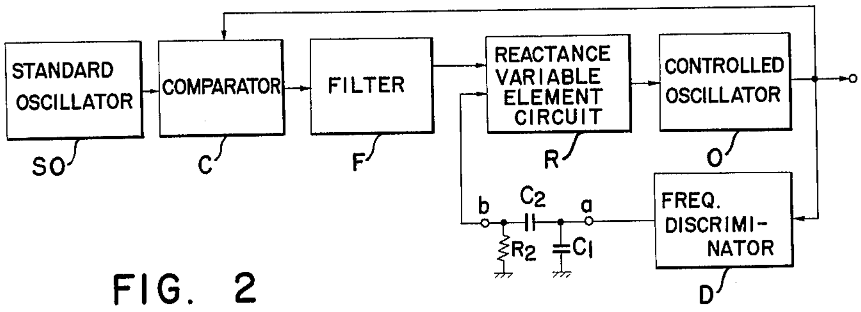
FIGURE 1 is a block diagram showing one embodiment of the invention.

In the automatic phase control circuit embodying the invention, there are provided as shown in FIGURE 1 a standard oscillator SO, a controlled oscillator O, a low-pass filter F, a reactance variable element circuit R, and a phase comparator C which detects the difference between the phases of the output frequency of the controlled oscillator O and the reference frequency, sends this difference through the low-pass filter F, and applies the result to the reactance variable element circuit R, thereby effecting control so as to cause synchronism between the oscillation frequency of the oscillator O and the reference frequency.

With only the above described arrangement of an automatic phase control loop, there is the possibility of the above mentioned two frequencies not synchronizing. According to the invention, however, this possibility is eliminated by applying the oscillation frequency of the oscillator O to a frequency discriminator D wherein the center frequency is the reference frequency and applying the output of the discriminator D through a capacitor $C_1$ and a differentiating circuit $C_2R_2$ to the reactance variable element circuit R.

This feature of the invention may be described more fully as follows by considering the case where the difference $(f-f_0)$ between the oscillation frequency $f$ of the oscillator O and the center frequency (reference frequency) $f_0$ of the frequency discriminator D is not within the frequency range wherein a drawing effect in the automatic phase control loop can occur, that is, the case where said difference is in a frequency range wherein a drawing effect cannot occur with only the automatic phase control loop. In this case, the circuit loop according to the present invention causes the output of the oscillator O to undergo hunting automatically along a characteristic curve of the frequency discriminator D, thereby forcing it into the frequency range in which operation of the automatic phase control loop is possible.

Figure 2:
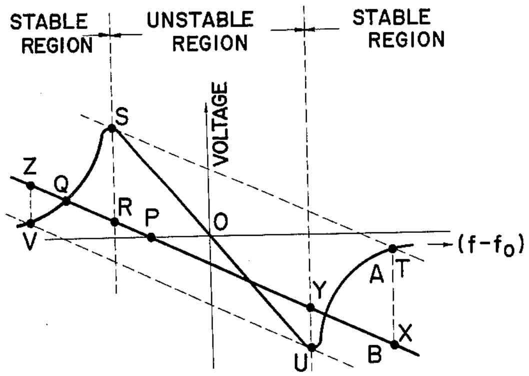
FIGURE 2 is a graphical representation indicating the operational characteristics of the embodiment shown in FIGURE 1.

The manner in which this hunting is caused to take place is graphically indicated in FIGURE 2, in which: curve A represents the discriminator characteristic; curve B represents the reactance characteristic of the reactance variable element circuit R; points Q and points S, T, U, and V represent operational points corresponding to the operation at the circuit point $a$ in the control loop; and points P and Q, R, X, Y, Z represent operational points corresponding to the operation at the circuit point $b$ in the control loop.

Even in the case when the aforementioned difference $(f-f_0)$ is at the point P outside of the frequency range wherein a drawing effect of the automatic phase control loop can occur, if the product of the discriminator sensitivity and the reactance modulation sensitivity in the unstable region between S and U is greater than 1 (unity), that is, if the slope of the discriminator characteristic curve A between S and U is greater than the slope of the reactance characteristic curve B, the point P will shift to the stable point Q.

The voltage produced at the point $b$ in the loop in accordance with the point Q is progressively reduced by the discharging of the capacitor $C_2$ until the point R is reached. Then the operational point at the point $a$ in the loop jumps from the peak S of the discriminator characteristic curve A to the point T in the stable region, and, accordingly, the point R jumps to the point X. The operational point which has jumped to the point X is shifted to the point Y by the discharging of the capacitor $C_2$, at which time, the point T jumps from the point U, over the unstable region, to the point V. Simultaneously, the point Y jumps to the point Z.

In this manner, the operation at the circuit point $a$ in the control loop is repeated in the sequence of S→T→U→V→S, and the operation at the circuit point $b$ is repeated in the sequence of Z→R→X→Y→Z.

If, in this hunting operation, the speed with which the oscillation frequency of the oscillator O traverses the center frequency is excessive, the synchronism of the automatic phase control loop operating simultaneously cannot be accomplished satisfactorily. In order to slow down this hunting speed, a capacitor $C_1$ of high capacitance is provided in front of the differentiating circuit consisting of the capacitor $C_2$ and resistance $R_2$. The integration circuit formed by this capacitor $C_1$ and the internal resistance possessed by the frequency discriminator D suppresses any abrupt variation of the hunting operation, thereby lowering the hunting speed.

However, unless the capacitor satisfies the following condition, it is not possible to cause the above mentioned hunting.

$$C_1R_1<C_2R_2(K-1)$$

where:

$R_1$ is the internal resistance of the frequency discriminator; and

K is the loop gain (product of the frequency discriminator sensitivity and the reactance modulation sensitivity).

Figure 3:
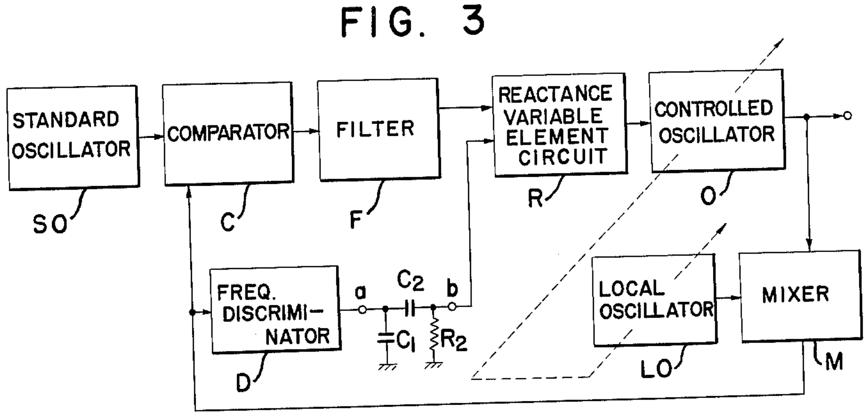
FIGURE 3 is a block diagram showing another embodiment of the invention.

Another embodiment of the invention in the case wherein a controlled oscillator is controlled by comparison of the center frequency of the controlled oscillator with a reference frequency is shown in FIGURE 3. In this circuit there are provided a local oscillator LO and a mixer M in addition to components similar to those in the circuit shown in FIGURE 1, namely, a standard oscillator SO, a phase comparator C, a low-pass filter F, a reactance variable element circuit R, a controlled oscillator O, a frequency discriminator D, capacitors $C_1$ and $C_2$, and a resistance $R_2$.

The mixer M creates an intermediate frequency ($f \sim f_L$) with the oscillation frequency $f$ of the controlled oscillator O and the frequency $f_L$ of the local oscillator LO, and this intermediate frequency is applied to the phase comparator C and to the frequency discriminator D in which the reference frequency is the center frequency. Accordingly, between the intermediate frequency and the reference frequency, there is exactly the same relationship as that between the controlled oscillator frequency and the reference frequency in the embodiment shown in FIGURE 1, and the operational characteristics indicated in FIGURE 2 apply also to this circuit shown in FIGURE 3.

It should be understood, of course, that the foregoing disclosure relates to only preferred embodiments of the invention and that it is intended to cover all changes and modifications of the examples of the invention herein chosen for the purposes of the disclosure, which do not constitute departures from the spirit and scope of the invention as set forth in the appended claims.

What we claim is:

1. In a control circuit wherein there are provided a phase comparator, a reactance variable element circuit, and a self-excited type oscillator, and the oscillator is controlled by deriving, by means of the phase comparator, a voltage corresponding to the phase difference between a reference frequency and the oscillation frequency of the oscillator and applying said voltage to the reactance variable element circuit, a positive feedback circuit comprising a frequency discriminator, a resistance capacitance differentiating circuit, and a capacitor of capacitance $C_1$ which satisfies the relationship expressed mathematically by $C_1R_1<T_2(K-1)$, (where $R_1$ is the internal resistance of the frequency discriminator, $T_2$ is the time constant of the said differentiating circuit, and K is the product of the discrimination sensitivity of the frequency dicriminator and the reactance modulation sensitivity of the reactance variable element circuit), said positive feedback circuit being provided between the oscillator and the reactance variable element circuit, thereby to form an automatic phase control circuit.

2. In a circuit wherein there are provided a phase comparator, a reactance variable element circuit, and a self-excited type oscillator, and the oscillator is controlled by deriving, by means of the phase comparator, a voltage corresponding to the phase difference between a reference frequency and an intermediate frequency of the oscillator frequency of the oscillator and applying said voltage to the reactance variable element circuit, a positive feedback circuit comprising a frequency discriminator, a resistence capacitance differentiating circuit, and a capacitor of capacitance $C_1$ which satisfies the relationship expressed mathematically by $C_1R_1<T_2(K-1)$, (where $R_1$ is the internal resistance of the frequency discriminator, $T_2$ is the time constant of the said differentiating circuit, and K is the product of the discrimination sensitivity of the frequency discriminator and the reactance modulation sensitivity of the reactance variable element circuit), said positive feedback circuit being provided between the oscillator and the reactance variable element circuit, thereby to form an automatic phase control circuit.

No references cited.

NATHAN KAUFMAN, *Acting Primary Examiner.*

J. KOMINSKI, *Assistant Examiner.*